United States Patent
Arai et al.

(10) Patent No.: US 8,120,098 B2
(45) Date of Patent: Feb. 21, 2012

(54) SEMICONDUCTOR DEVICE AND POWER CONVERTER USING THE SAME

(75) Inventors: Taiga Arai, Mito (JP); Mutsuhiro Mori, Mito (JP)

(73) Assignee: Hitachi, Ltd., Tokyo (JP)

( * ) Notice: Subject to any disclaimer, the term of this patent is extended or adjusted under 35 U.S.C. 154(b) by 113 days.

(21) Appl. No.: 12/537,548

(22) Filed: Aug. 7, 2009

(65) Prior Publication Data
US 2010/0039844 A1    Feb. 18, 2010

(30) Foreign Application Priority Data

Aug. 12, 2008 (JP) ................................ 2008-207556

(51) Int. Cl.
*H01L 29/66* (2006.01)
(52) U.S. Cl. ................ 257/330; 257/E29.027
(58) Field of Classification Search .......... 257/213, 257/288, 328–335, 341, E29.001, E29.002, 257/E29.005, E29.024, E29.026, E29.027, 257/E29.028
See application file for complete search history.

(56) References Cited

U.S. PATENT DOCUMENTS

| | | | |
|---|---|---|---|
| 2006/0076617 A1* | 4/2006 | Shenoy et al. | 257/333 |
| 2007/0194346 A1* | 8/2007 | Nagase et al. | 257/146 |
| 2008/0012040 A1* | 1/2008 | Saito et al. | 257/133 |

FOREIGN PATENT DOCUMENTS

| | | |
|---|---|---|
| EP | 1032047 A2 * | 8/2000 |
| JP | 2000-307116 | 11/2000 |
| JP | 2006-222455 | 8/2006 |
| JP | 2007-150121 | 6/2007 |

* cited by examiner

*Primary Examiner* — Ha Tran T Nguyen
*Assistant Examiner* — Kevin Quinto
(74) *Attorney, Agent, or Firm* — Brundidge & Stanger, P.C.

(57) ABSTRACT

A semiconductor device which can avoid increase of a conduction loss of an IGBT, secure a low noise characteristic and also reduce a switch loss. The switching device is of a trench gate type, in which a drift n⁻ layer 110 is exposed to its main surface to a floating p layer 126 and to trench gates. In other words, the floating p layer 126 is provided within the drift n⁻ layer 110 to be spaced from the trench gates.

8 Claims, 16 Drawing Sheets

Vak: ANODE-TO-CATHODE VOLTAGE

Ia: ANODE CURRENT

Vce: COLLECTOR-TO-EMITTER VOLTAGE

Ic: COLLECTOR CURRENT

SEMICONDUCTOR DEVICE AND POWER CONVERTER USING THE SAME

BACKGROUND OF THE INVENTION

The present invention relates to semiconductor devices and power converters using the semiconductor devices and more particularly, to a semiconductor device and a power converter using the semiconductor device, which are suitably used in wide applications ranging from small power equipment such as an air conditioner or a microwave oven to a large power equipment such as an inverter for use in railroad or ironworks.

An insulated gate bipolar transistor (which will be referred to as IGBT, hereinafter) is a switching element which controls a current flowing between collector and emitter electrodes caused by a voltage applied to a gate electrode. A power range controllable by the switching element is between tens of watts and a level exceeding one hundred thousand watts, and a switching frequency range is also wide and between tens of hertz to hundreds of hertz. In order to make the most of such a feature, the IGBT is used in a broad fields ranging from small power home equipment such as an air conditioner or a microwave oven to large power equipment such as an inverter for use in railroad or ironworks.

In order to increase the efficiency of a power converter or the like to which the IGBT is applied, the IGBT has been required to reduce its loss and to take various measures.

The above loss includes a conduction loss, a turn-on loss, and a turn-off loss. A voltage generated between collector and emitter electrodes during ON state of the IGBT is called ON voltage, which is proportional to the conduction loss. For this reason, the ON voltage is used as an index of the conduction loss. Thus, it becomes important for the IGBT to reduce the ON voltage, the turn-on loss, and the turn-off loss.

FIG. 13 shows a cross-sectional structure of a first prior art. More specifically, FIG. 13 corresponds to a trench insulated gate type IGBT 12 for improving electrical characteristics which is set forth in Paragraph [0056] in JP-A-2000-307116.

In FIG. 13, reference numeral 500 denotes a collector electrode, numeral 100 denotes a p layer contacted with the collector electrode 500 with a low contact resistance, 112 denotes an n layer having a carrier concentration lower than that of the p layer 100, 110 a drift n$^-$ layer having a carrier concentration lower than that of the n layer 112, 120 a channel p layer, 121 a p$^+$ layer, 125 a floating p layer, 130 an n$^+$ layer, 600 an emitter electrode contacted with the p$^+$ layer 121 and the n$^+$ layer 130 with a low contact resistance, 300 a gate insulated film, 200 a gate electrode, 401 an insulating film, 501 a collector terminal, 601 an emitter terminal, 201 a gate terminal.

The IGBT is featured in that a gate width is shortened by thinning out the emitter electrode 600 from the general trench insulated gate IGBT, thus reducing a saturation current. As a result, a current flowing when the IGBT is short-circuited is suppressed with an improved breakdown resistance.

The IGBT has another feature that part of a Hall current flows through the floating p layer 125 when the emitter electrode 600 is removed and instead the floating p layer 125 is introduced. As a result, a hole concentration in the vicinity of the emitter is increased, a resistance is reduced, and the ON voltage is reduced, which results in reduction of the loss of the IGBT and in reduction of the loss of a semiconductor power converter using the IGBT.

However, it has been found that the aforementioned IGBT of FIG. 13 has problems which follow.

The IGBT of FIG. 13 operates as follows when the IGBT is turned ON from its OFF state. In the OFF state, the channel p layer 120 or the floating p layer 125 has nearly the same potential as the emitter electrode 600, and a voltage between the collector and the emitter is shared by the drift n$^-$ layer 110. When a desired threshold voltage for forming a channel inversion layer in the channel p layer 120, electrons are injected from the n$^+$ layer 130 through the channel inversion layer into the drift n$^-$ layer 110. This causes the drift n$^-$ layer 110 to modulate its conductivity, so that a Hall current flows from the channel p layer 120 through the n layer 112 into the drift n$^-$ layer 110, whereby a conduction state is put between the collector and the emitter.

In the course of the turn-on transition, the floating p layer 125 has a potential higher than the gate electrode 200 during a certain time. This causes the floating p layer 125 is coupled to the potential of the gate electrode 200 through a gate capacity. Further, since a displacement current is passed through the gate capacity, the displacement current causes a voltage to be induced at a gate resistance present between the gate electrode 200 and the emitter electrode 600, which results in that the potential of the gate electrode 200 is increased even with this induced voltage.

As a result, the potential of the gate electrode 200 is increased by the floating p layer 125, so that the injection of electrons and the conduction modulation are accelerated and (dVce/dt) becomes large. This involves such a phenomenon that an overvoltage noise Vp for diodes of paired arms becomes high in an inverter circuit. Since this influence may exceed the rated voltages of the diodes, the IGBT of FIG. 13 is required to take its measure.

As mentioned above, the displacement current flows through the gate resistance to generate a voltage. Thus, even the gate resistance is made large to control the displacement current, the voltage induced on the gate resistance cannot be sufficiently reduced, and on the contrary, an increase in the turn-on time results in that the switch loss is largely influenced.

FIG. 14 shows turn-on waveforms for the IGBT of FIG. 13 and reverse recovery waveforms for diodes of paired arms. In the drawing, Vp denotes backward overvoltage noise when the diodes of the paired arms have an anode-to-cathode voltage Vak. The backward overvoltage noise Vp is generated depending upon a collector-to-emitter voltage Vce of the IGBT.

FIG. 15 shows small-current turn-on waveforms for the IGBT of FIG. 13 and reverse recovery waveforms for diodes of paired arms. The backward overvoltage noise Vp tends to be further increased upon small-current turn-on operation.

FIG. 17 shows an example of a dependency of Vp to a turn-on current of an IGBT normalized by a rated current. When the IGBT of FIG. 13 is used, there has been observed from experiments and calculations of the inventors of this application a tendency that, as shown by a solid line indicating the structure of a prior art in FIG. 17, Vp becomes large with a small current and becomes large, in particular, upon turn-on of a small current corresponding to $\frac{1}{10}$ to $\frac{1}{20}$ of the rated current. The Vp may possibly exceed the rated voltages of the diodes, for which some measures are required to be taken.

SUMMARY OF THE INVENTION

From the view of the above respects, it is an object of the present invention to provide a semiconductor device which can reduce a switch loss while avoiding increase of the conduction loss of an IGBT and securing a low noise characteristic, and also a power converter using the semiconductor device.

In accordance with an aspect of the present invention, the above object is attained by providing a semiconductor device which includes a semiconductor substrate having a pair of main surfaces; a first semiconductor region of a first conductivity type positioned adjacent to one of the main surfaces of the semiconductor substrate and located within the substrate; a second semiconductor region of a second conductivity type provided adjacent to the first semiconductor region and having a carrier concentration lower than the carrier concentration of the first semiconductor region; a third semiconductor region of the second conductivity type provided adjacent to the second semiconductor region and having a carrier concentration lower than the carrier concentration of the second semiconductor region; a plurality of MOS type trench gates extended from one of the main surfaces of the semiconductor substrate into the third semiconductor region to have at least two sorts of different intervals; a fourth semiconductor region of the first conductivity type provided between the MOS type trench gates having a narrow adjacent interval and having a carrier concentration higher than the carrier concentration of the third semiconductor region; a fifth semiconductor region of the second conductivity type provided between the MOS type trench gates having the narrow adjacent interval, located within the fourth semiconductor region to be adjacent to the MOS type trench gates, and having a carrier concentration higher than the carrier concentration of the fourth semiconductor region; a sixth semiconductor region of the first conductivity type located between the MOS type trench gates having the narrow adjacent intervals and having a carrier concentration higher than the carrier concentration of the third semiconductor region; a first electrode located between the MOS type trench gates having the narrow adjacent interval to be contacted with the fourth and fifth semiconductor regions; and a second electrode contacted with the first semiconductor region. The third semiconductor region is exposed to its main surface between the sixth semiconductor region and the trench gates.

In accordance with another aspect of the present invention, the above object is attained by providing a power converter which includes a pair of DC terminals, AC terminals corresponding in number to phases of an AC source, and a plurality of power conversion units connected between the pair of DC terminals. Each of the power conversion units has a series circuit of two parallel circuits each having a switching element and a diode of a polarity opposite to the switching element. The power conversion units have the AC terminals as different mutual interconnection points between the two parallel circuits. The switching element is the aforementioned semiconductor device.

In accordance with the present invention, the IGBT can avoid increase of a conduction loss, secure a low noise characteristic and also reduce a switch loss. The power converter for use in an inverter system or the like using the semiconductor device can increase an efficiency.

Other objects, features and advantages of the invention will become apparent from the following description of the embodiments of the invention taken in conjunction with the accompanying drawings.

DETAILED DESCRIPTION OF THE EMBODIMENTS

Embodiments of the present invention will be explained with reference to the attached drawings.

Embodiment 1

Figure 1:
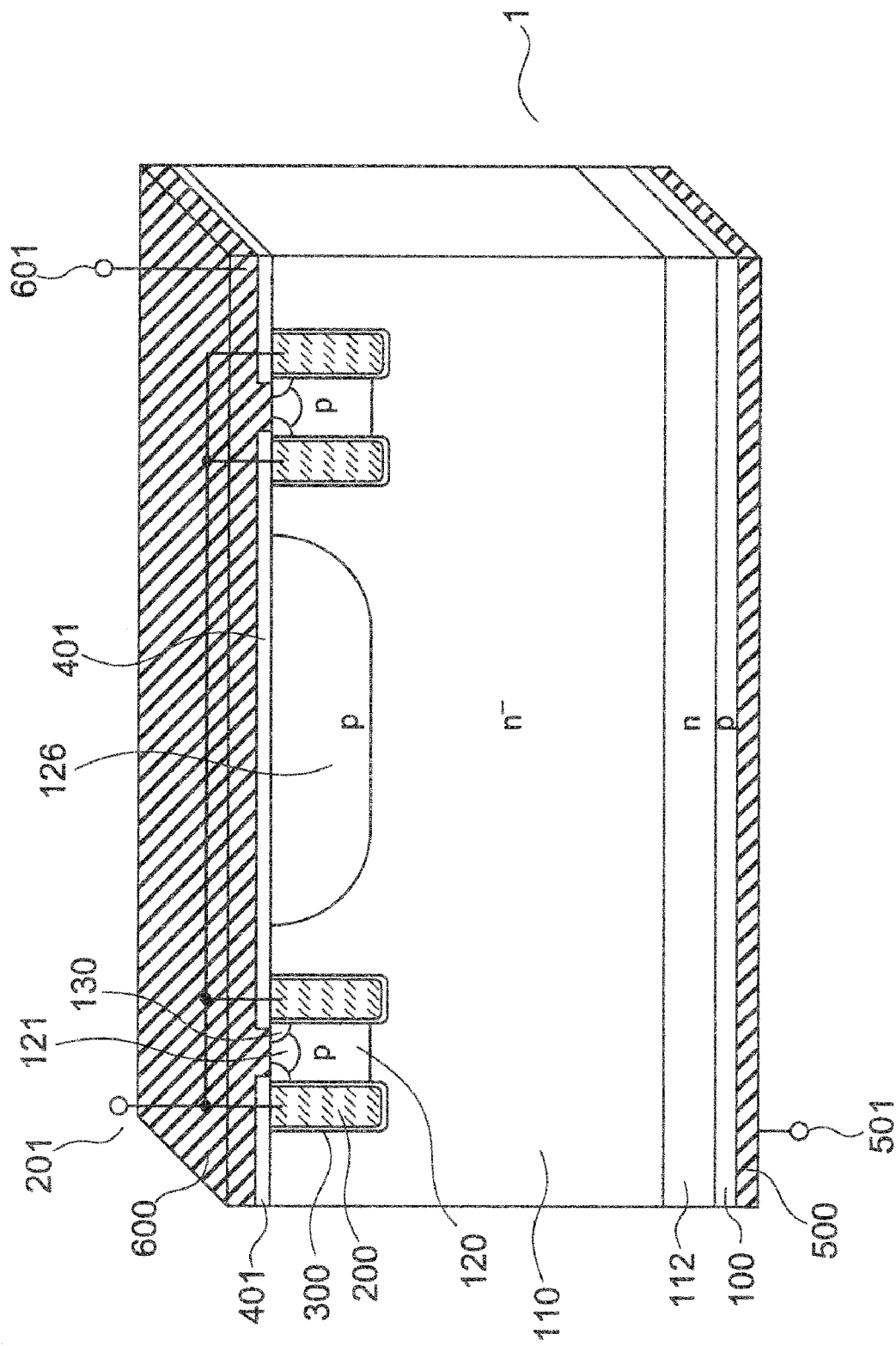
FIG. 1 shows a cross-sectional view of a semiconductor device in accordance with a first embodiment of the present invention.

FIG. 1 shows a cross-sectional view of a semiconductor device in accordance with a first embodiment of the present invention. In FIG. 1, constituent elements having the same reference numerals or symbols are denoted by the same numerals or symbols as those in FIG. 13.

Figure 13:
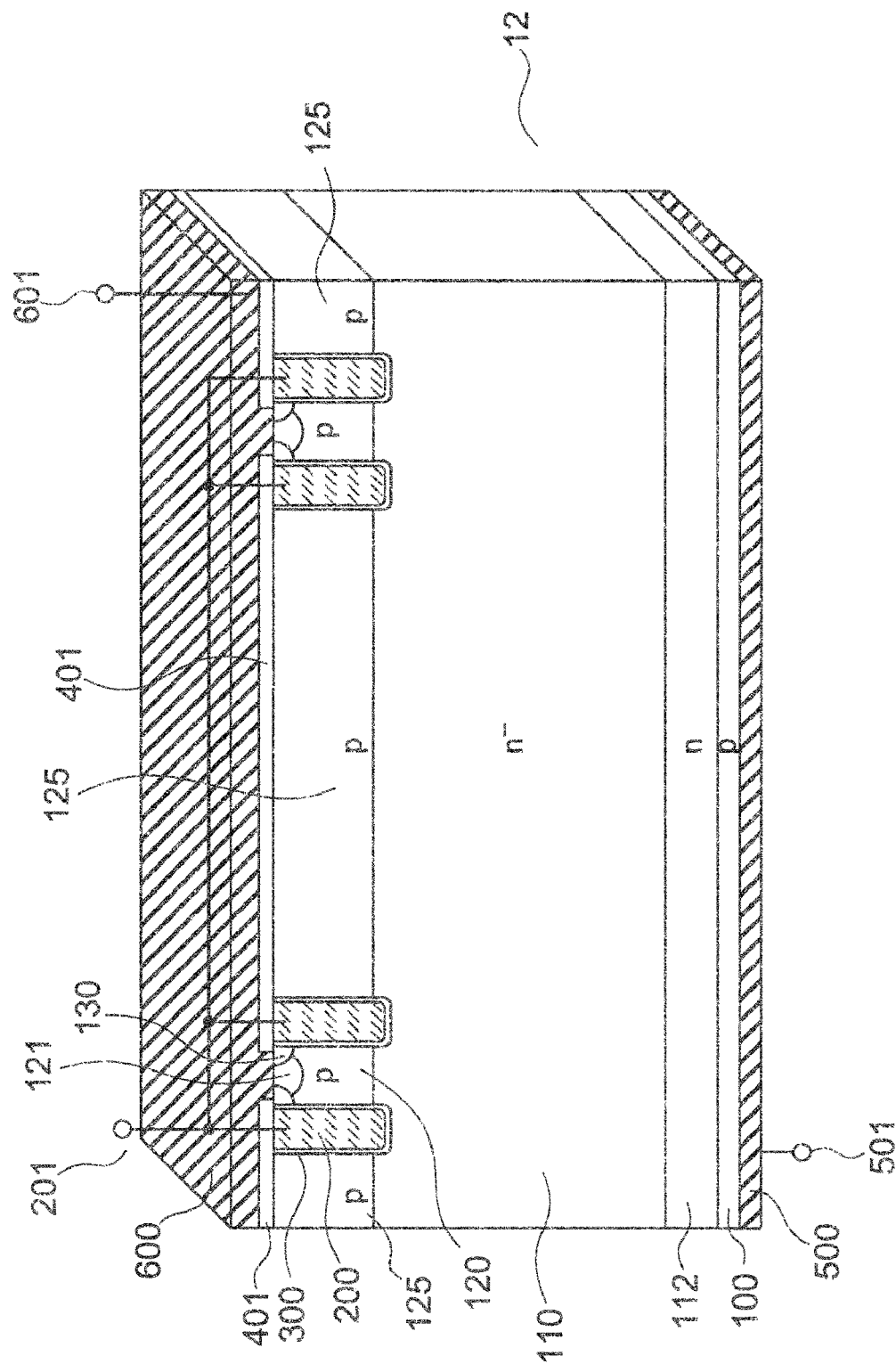
FIG. 13 shows a cross-sectional view of a prior art semiconductor device.
Figure 14:
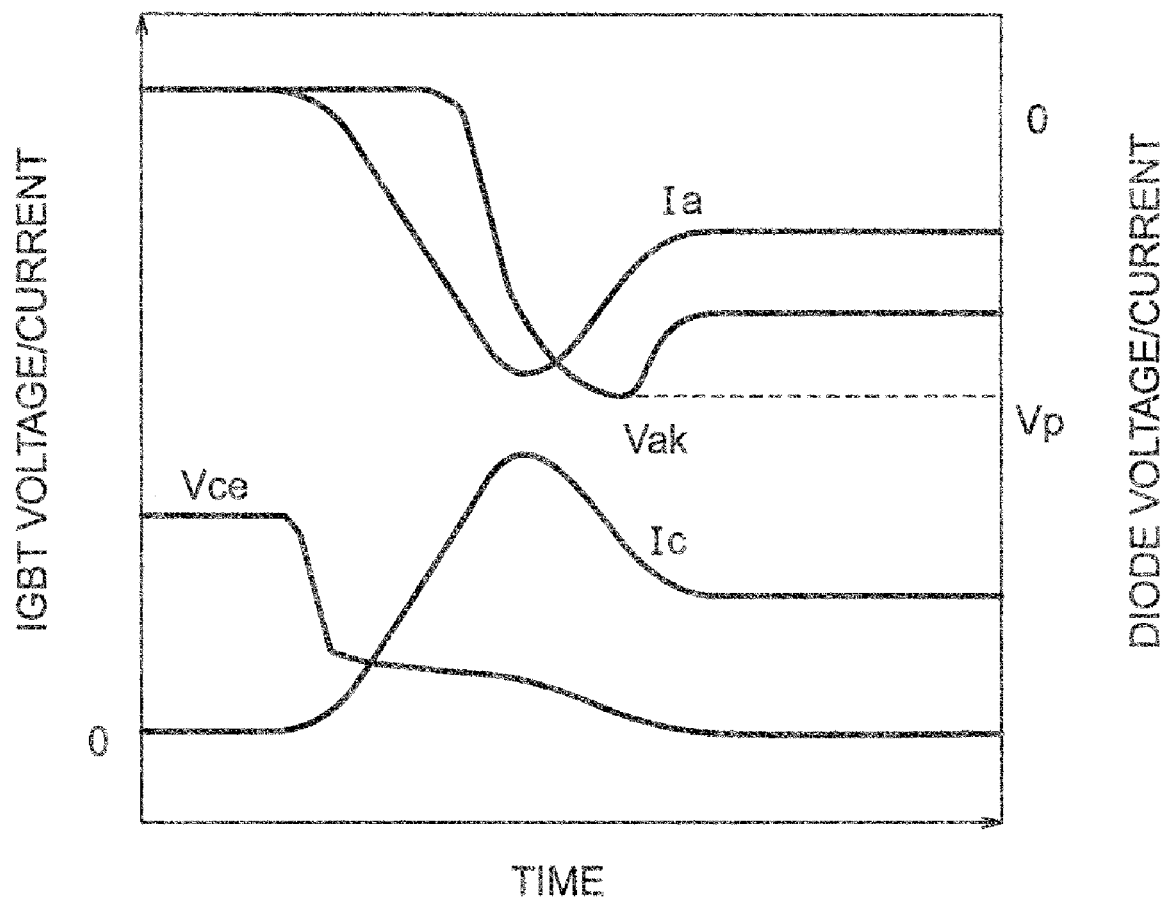
FIG. 14 shows rated current turn-on waveforms of an IGBT and reverse recovery waveforms of diodes of a pair of arms in an inverter circuit.
Figure 15:
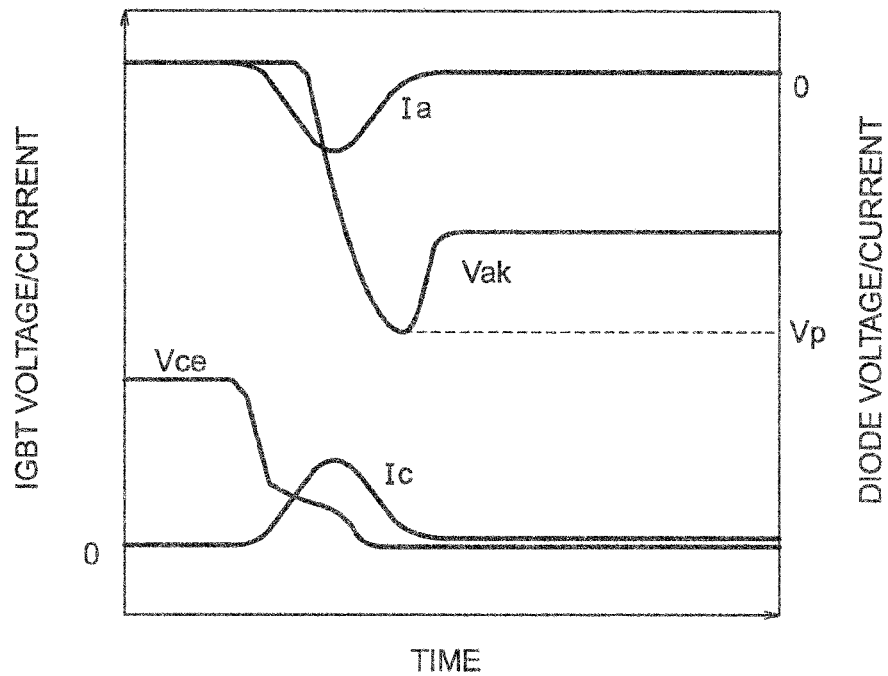
FIG. 15 shows small current turn-on waveforms of the prior art IGBT and reverse recovery waveforms of diodes of a pair of arms in an inverter circuit.

As shown in the same drawing, in the present embodiment, in place of a floating p layer 125 adjacent to a gate electrode 200 in the structure of a prior art of FIG. 13, a floating p layer 126 is provided between trench gates with a drift n⁻ layer 110 disposed therebetween.

FIG. 1 is featured in that the floating p layer 126 is spaced from the trench gates by a distance with the drift n⁻ layer 110 disposed therebetween. With such a structure, the drift n⁻ layer 110 is exposed to its main surface to the drift n⁻ layer 110 and to the trench gates at the spaced zones.

Even in FIG. 1, similar to FIG. 13, the floating p layer 126 has such a state as to have a potential transiently higher than the trench gates upon turn-on operation. However, since the drift n⁻ layer 110 is disposed between the floating p layer 126 and the trench gates, the influence is applied indirectly through a resistance. As a result, as shown in FIG. 1, the potential increase of the gate electrode causing increase of a rate (dVce/dt) of change of a collector-to-emitter voltage can be suppressed.

In particular, the part of the drift n⁻ layer adjacent to the trench gates forms an accumulation layer having a low resistance. For this reason, when the floating p layer 126 is located closer to the trench gates even by a small distance, this influences increase of the potential of the floating p layer 126. However, the overvoltage noise Vp of the paired arm diodes can be suppressed more effectively when the spaced distance between the floating p layer 126 and the trench gates is set not to be smaller than zero and to be larger.

Figure 16:
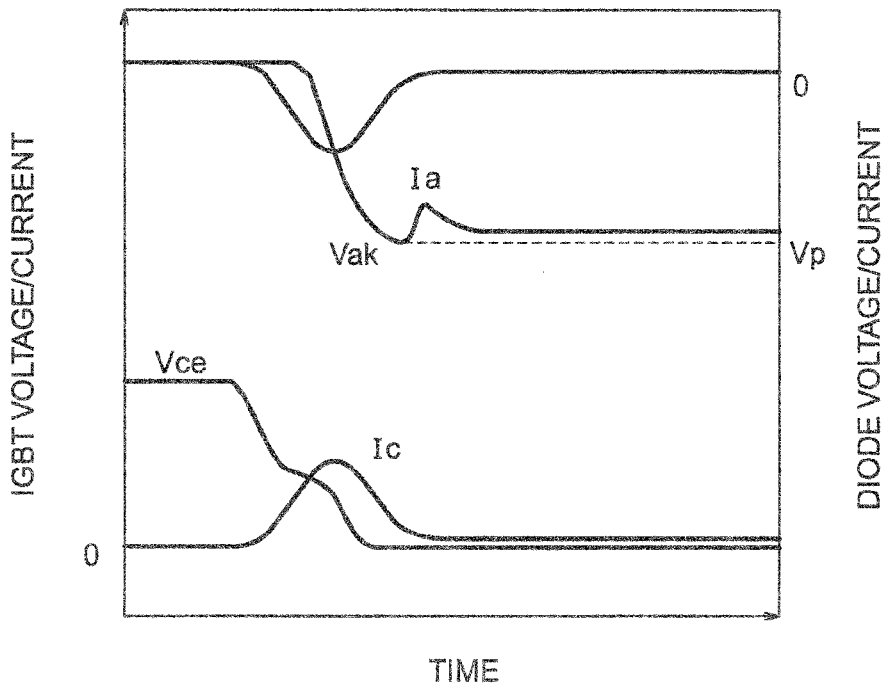
FIG. 16 shows small current turn-on waveforms of an IGBT to which the present invention is applied and reverse recovery waveforms of diodes of a pair of diodes in an inverter circuit.

FIG. 16 shows small current turn-on waveforms of the IGBT of FIG. 1 and reverse recovery waveforms of diodes in a pair of arms. The overvoltage noise Vp tends to be suppressed upon small current turn-on operation.

Figure 17:
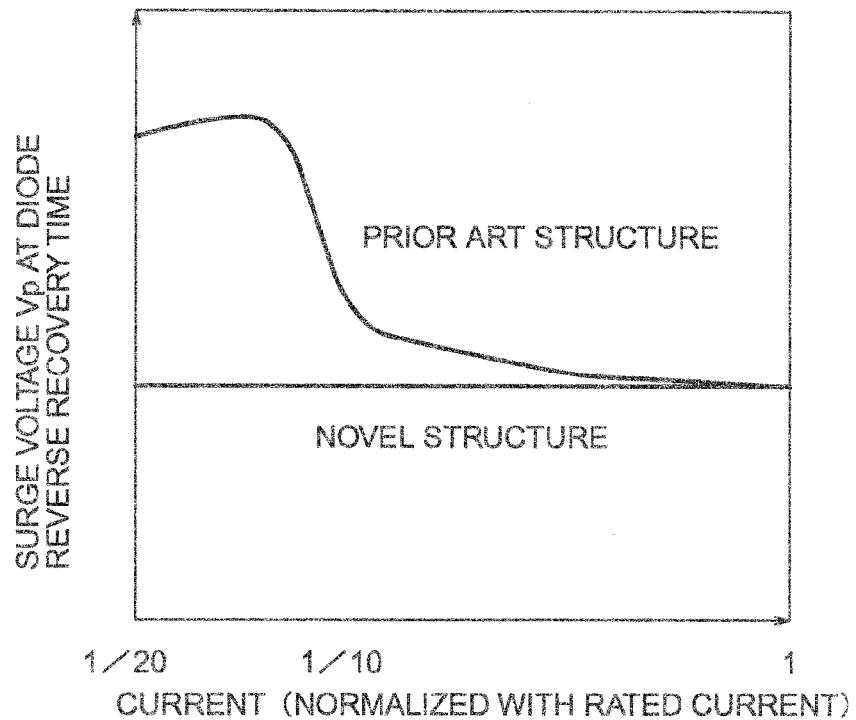
FIG. 17 is a graph for explaining a difference in structure between the prior art and the present invention.

FIG. 17 shows an example of a dependency of Vp to a turn-on current in an IGBT normalized with a rated current. A solid line indicating a prior art structure is when the IGBT of FIG. 13 is used, and a solid line indicating the novel structure of the present invention is when the IGBT of FIG. 1 is used. When compared with the prior art structure when VP becomes high with s small current, Vp is suppressed and stable even with the small current in the novel structure.

In the novel structure, the floating p layer 126 is provided and causes increase in the potential of the floating p layer 126 not to be suppressed. Thus, as in FIG. 13, some of a Hall current flows through the floating p layer 126 to the emitter, resulting in increase of a hole concentration in the vicinity of the emitter and in reduction of an ON voltage.

Upon OFF time, further, depletion is advanced not only by the channel p layer 120 but also by the floating p layer 126. Since this can reduce an electric-field concentration in the lower side of the trench gates, a breakdown voltage can be surely increased, an emitter-to-emitter distance at the side of the floating p layer 126 can be made large, a short-circuit resistance can be increased due to the suppression of a saturation current, and a gate yield also can be effectively increased.

Figure 18:
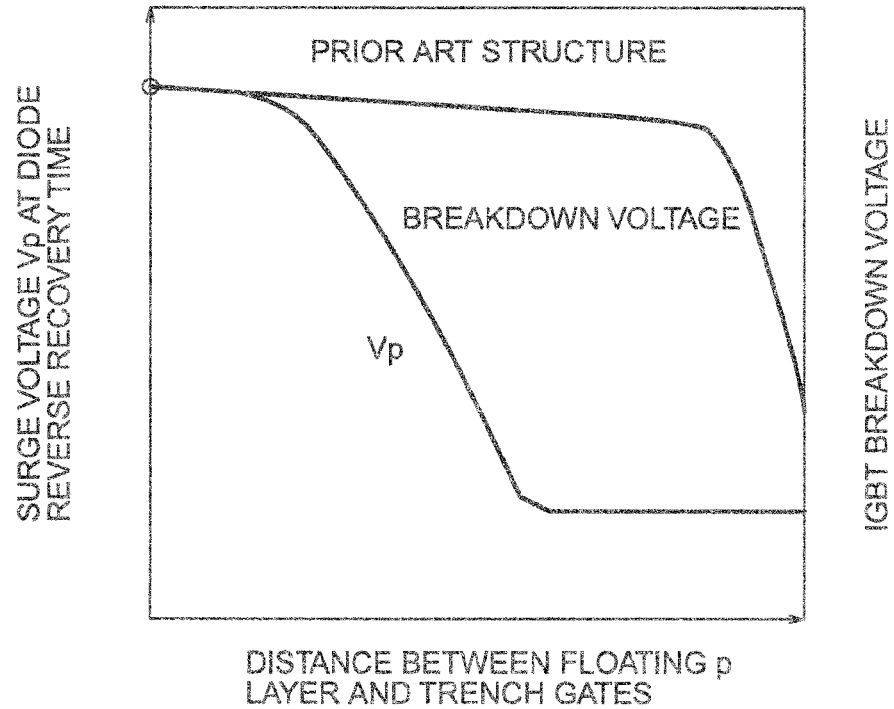
FIG. 18 is a graph for explaining another difference in structure between the prior art and the present invention.

FIG. 18 shows a calculation result of dependencies of overvoltage noise Vp of diodes of paired arms and breakdown voltage of an IGBT of a distance spaced between a floating p layer and trench gates. As mentioned above, when the spaced distance is set not to be smaller than zero, Vp can be effectively reduced.

Meanwhile, the breakdown voltage abruptly drops when the spaced distance is set at a certain value. The IGBT is used as a high breakdown voltage element operating with a voltage generally from 100 volts to several thousands of volts. Since an element having a higher breakdown voltage uses a high resistance substrate, a depletion layer tends to be easily extended. Thus the distance spaced between the floating p layer and the trench gates for securing the breakdown voltage can be made long. However, the inventors of this application has found from calculations that, since the curvature of a curved portion of the floating p layer 126 or the depth and angular shape of the trench gates affect the breakdown voltage, the spaced distance is limited to a value not larger than 10 μm in order to secure a necessary breakdown voltage.

When the distance spaced between the floating p layer and the trench gates is zero in FIG. 18, the structure of the FIG. 13 corresponds to the prior art structure.

In order to further reduce the loss of this structure, when a maximum value of the carrier concentration of the p layer 100 in FIG. 1 is set at a value corresponding to 10 to 100 times the maximum value of the carrier concentration of the n layer 112, the turn-off loss can be reduced. When a total value of carrier concentrations is set at a value in a range from $1 \times 10^{12}$ cm⁻² to $1 \times 10^{13}$ cm⁻², the turn-off loss can be reduced more effectively and the thickness of the p layer 100 is set at a value desirably not larger than 3 μm.

The inventors of this application have also found from their experiments and calculations that the effect of such structure conditions lies in that the turn-off loss can be reduced when a quantity of carriers injected from the collector side is restricted to a suitable level upon the conduction operation to reduce the carrier concentration remaining in the collector side upon the turn-off operation and to quickly stop the current, and that compatibility can be achieved between the effects of On voltage reduction and saturation current suppression caused by the emitter-side structure. Similarly, even for another collector structure, the effects can be obtained when the emitter structure of the present invention is applied thereto. For example, in place of the n layer 112 to be sandwiched, the p layer 100 may have a structure of a non-punch-through type wherein the p layer is contacted directly with the drift n⁻ layer 110 or such a structure that the p layer 100 is used as a thick support substrate. In this way, the present invention is not limited by the aforementioned collector structure.

With the present structure, it is desirable that the collector electrode 500 be made of a metal containing a p type impurity and especially aluminum be employed as the p type impurity. This is valid for reducing the surface concentration of the p layer 100 contacted with the collector electrode 500 in the aforementioned structure, thus avoiding increase of the contact resistance. The inventors of this application have confirmed from their experiments that a suitable electric contact can be obtained between the collector electrode and the low-concentration p layer 100, with the result that the semiconductor device can secure loss reduction and the power converter can secure a high short-circuit resistance.

The structure of the present invention can implemented through an existing IGBT process, and the process can also be simplified when the floating p layer 126 is formed using a process common to the channel p layer 120. The arrangement of the IGBT as a basic structure is not limited to a stripe type illustrated in FIG. 1. The IGBT arrangement may be applied not only to existing layouts including a mesh structure but also to an IGBT of a p-channel MOS structure opposite to an IGBT of an n-channel MOS structure as in the present embodiment.

Embodiment: 2

Figure 2:
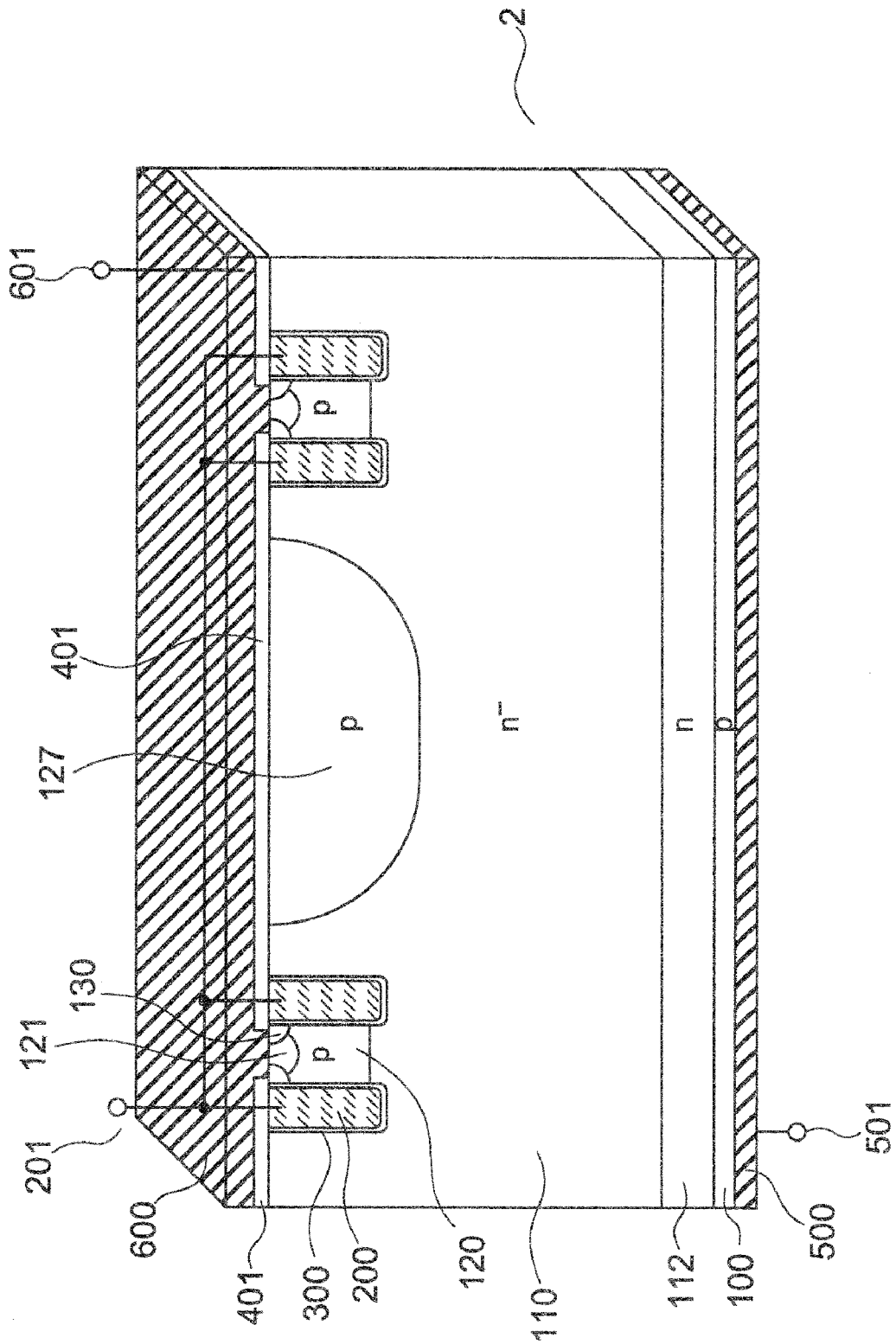
FIG. 2 shows a cross-sectional view of a semiconductor device in accordance with a second embodiment of the present invention.

FIG. 2 shows a cross-sectional view of a structure in accordance with a second embodiment of the present invention. In FIG. 2, constituent elements having the same reference numerals or symbols as those in FIG. 1 are denoted by the same reference numerals or symbols. In FIG. 2, reference numeral 127 denotes a floating p layer.

FIG. 2 is featured in that the floating p layer 126 illustrated in FIG. 1 is replaced with the floating p layer 127 of a structure wherein the floating p layer is formed to be deeper than the channel p layer 120 and the trench MOS gates, thus increasing a breakdown voltage.

With the structure of FIG. 2, it can be expected to further increase the breakdown voltage while keeping the effects of FIG. 1. In an OFF state, depletion is advanced from an interface between the channel p layer 120 and the drift n⁻ layer 110, and equipotential lines expanded parallelly to the interface reach interior of the drift n⁻ layer 110 located between the gates and the floating p layer 127 along the trench gates. As a result, an electric field is concentrated in a lower side of the trench gates, in particular, at a corner thereof at the side of the floating p layer 127, and the concentrated field becomes an avalanche start point. However, since depletion is advanced also from the floating p layer 127, the electric field concentration can be reduced by making deeper the floating p layer 127 than the channel p layer 120.

As already explained in the embodiment 1, an increase in the distance spaced between the floating p layer and the trench gates is associated with the reduction level of the overvoltage noise in the diode reverse recovery operation. Since the structure of FIG. 2 enables a breakdown voltage to be secured, however, the spaced distance can be set at a large value, thus suppressing the noise.

The present structure can have effects similar to those of the embodiment 1, and the variation set forth in the embodiment 1 can also have effects similar thereto, with optimum conditions similar thereto.

Embodiment 3

Figure 3:
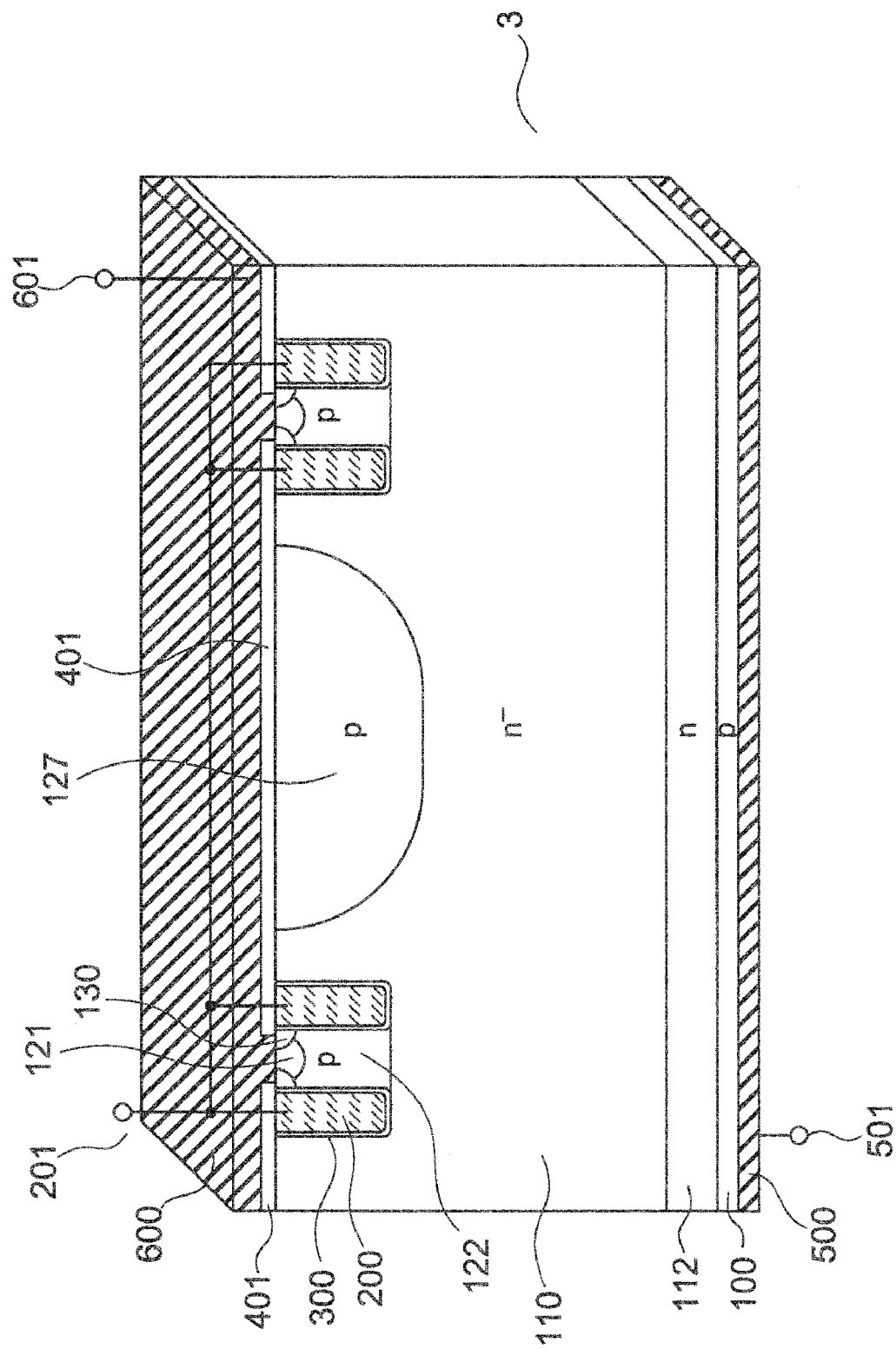
FIG. 3 shows a cross-sectional view of a semiconductor device in accordance with a third embodiment of the present invention.
Figure 4:
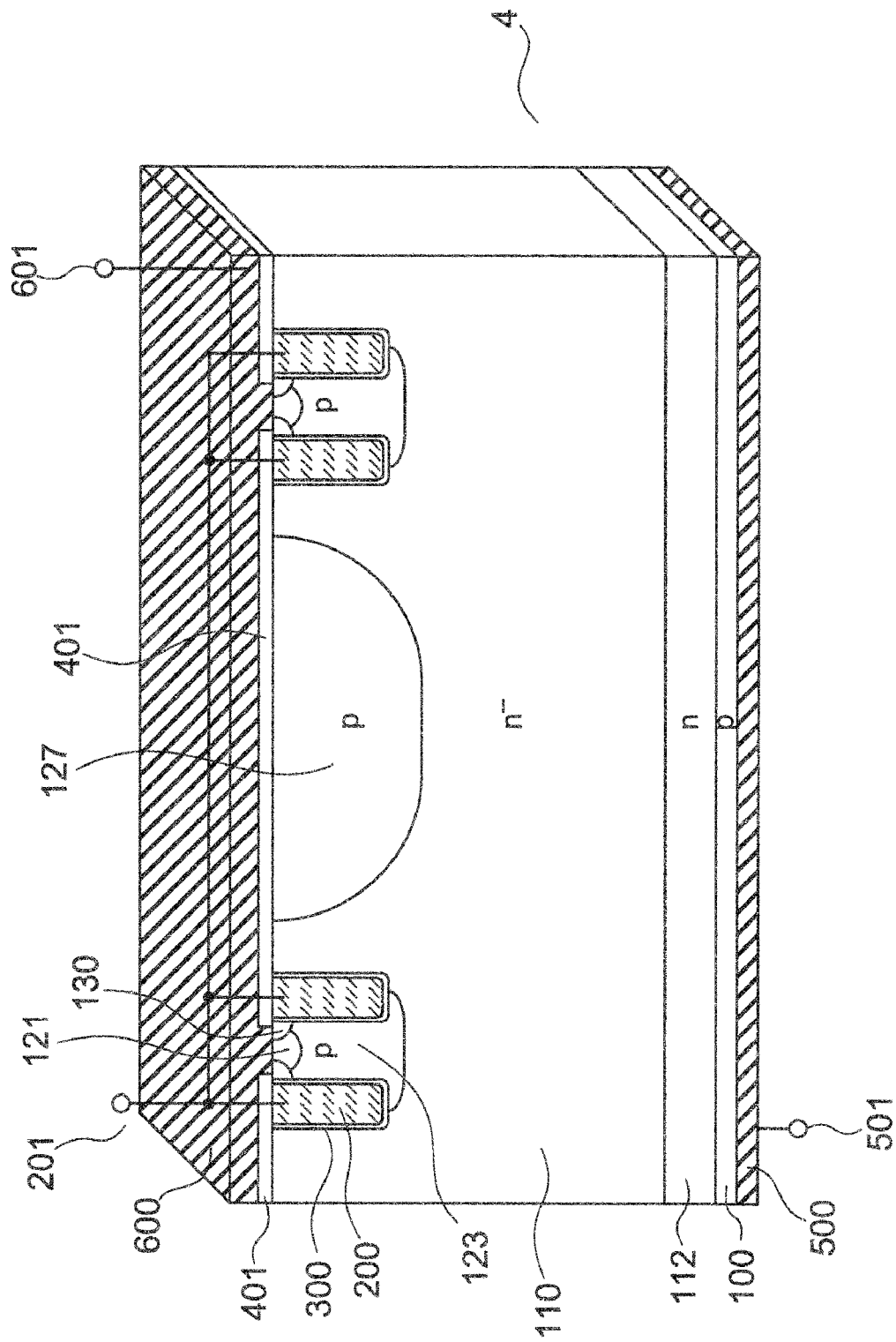
FIG. 4 shows a cross-sectional view of a semiconductor device as a variation of the third embodiment.
Figure 5:
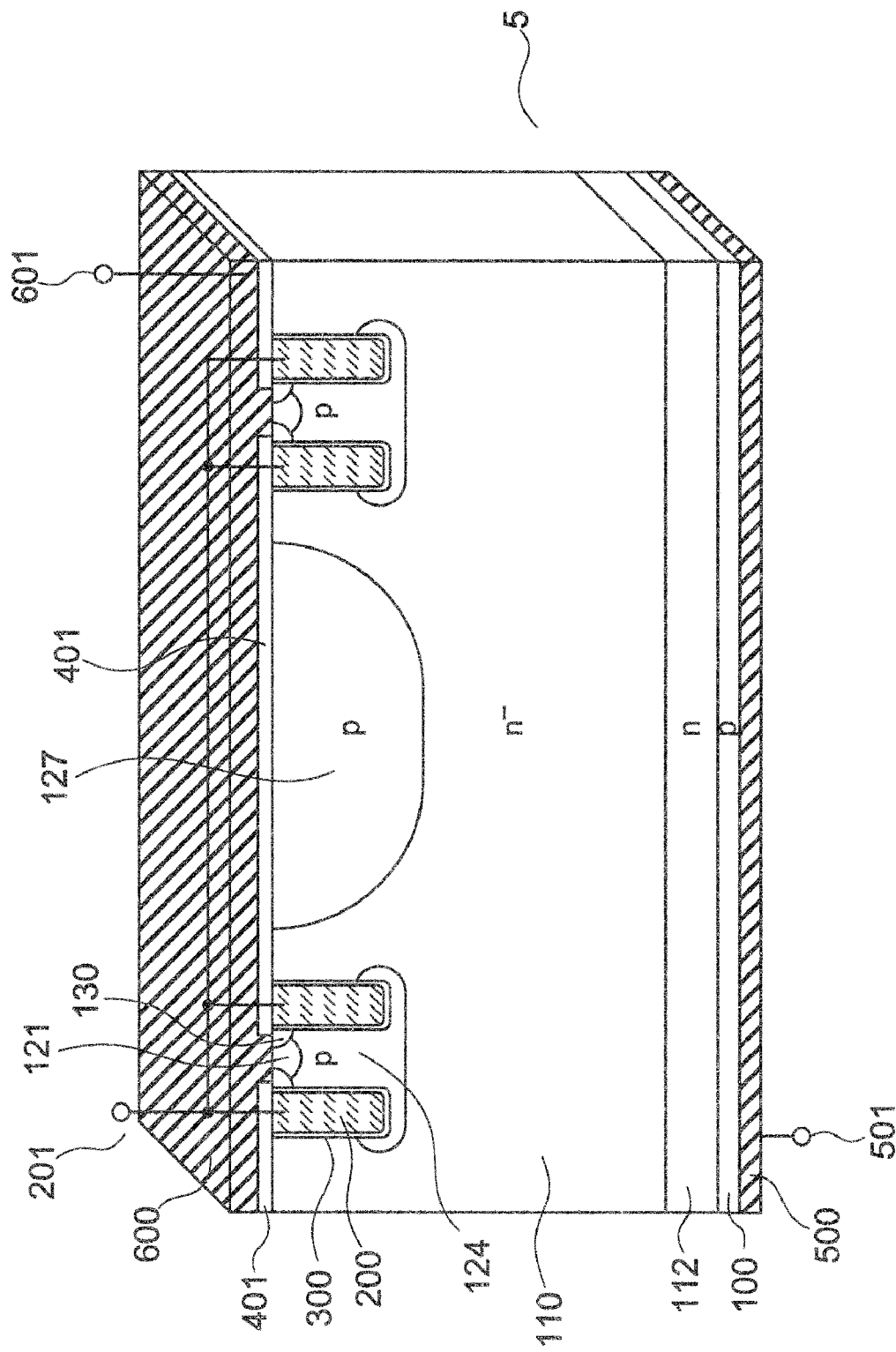
FIG. 5 shows a cross-sectional view of a semiconductor device as another variation of the third embodiment.

FIGS. 3, 4 and 5 show cross-sectional views of a structure in accordance with a third embodiment of the present invention. In FIGS. 3, 4 and 5, constituent elements having the same reference numerals or symbols as those in FIG. 1 are denoted by the same reference numerals or symbols. Reference numeral 122 in FIG. 3 denotes a channel p layer, Reference numeral 123 in FIG. 4 denotes a channel p layer, and Reference numeral 124 in FIG. 5 denotes a channel p layer.

FIGS. 3, 4 and 5 are featured in that the channel p layers 122, 123 and 124 are made deeper than the channel p layer 120 in FIG. 1. More specifically, FIGS. 3, 4 and 5 are featured in a structure wherein the channel p layer has nearly the same depth as the trench MOS gates, a structure wherein the channel p layer has such a depth as to cover the lower side of the trench MOS gates, and a structure wherein the channel p layer has such a depth as to cover the trench MOS gates as far as the side surface thereof opposed to the emitter electrode 600, respectively.

With such structures, similarly to the embodiment 2, it can be expected to effectively increase a breakdown voltage with the effects of the embodiment 1 kept. When the trench gates are formed so as not to be projected from the channel p layer 122 as shown in FIG. 3, when the channel p layer 123 is arranged so as to cover the lower side of the trench gates as shown in FIG. 4, or more effectively when the channel p layer 124 is arranged so as to cover corners of the trench gates at the side of the floating p layer 127 as shown in FIG. 5; electric field concentration as an avalanche start point determining the breakdown voltage can be suppressed, thus increasing the breakdown voltage.

As in FIG. 2, the structures of FIGS. 3, 4 and 5 can secure a high breakdown voltage, the distance spaced between the floating p layer 127 and the trench gates can be made large, thus suppressing the noise. In addition to the structures of FIGS. 3, 4 and 5, when the floating p layer 127 is made deeper as shown in FIG. 2, this can contribute to a high breakdown voltage effectively secured and to a low noise design.

These structures can have effects similar to those in the embodiment °, and the variation set forth in the embodiment 1 can also have effects similar thereto, with optimum conditions similar thereto.

Embodiment 4

Figure 6:
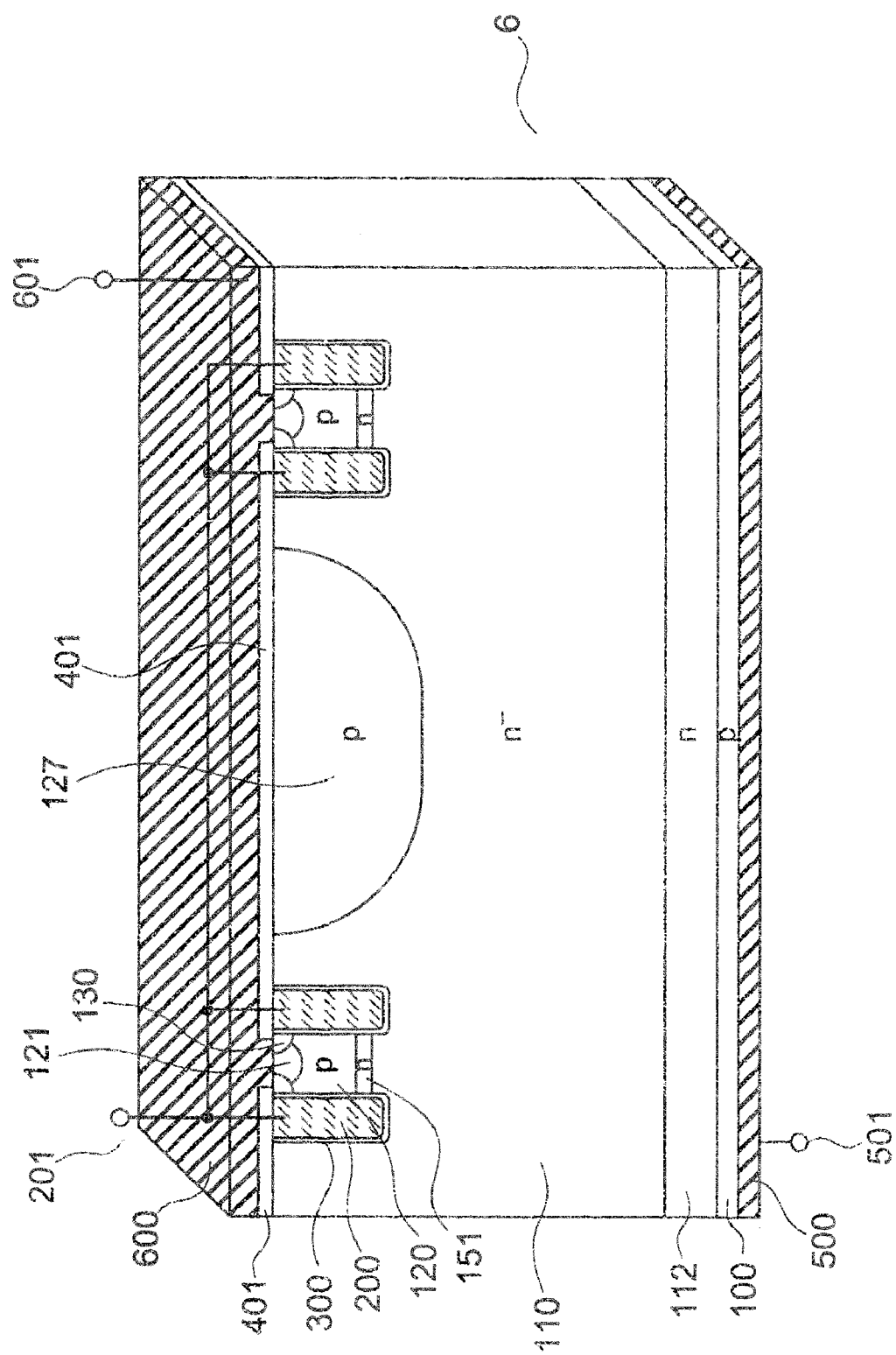
FIG. 6 shows a cross-sectional view of a semiconductor device in accordance with a fourth embodiment of the present invention.

FIG. 6 shows a cross-sectional view of a structure in accordance with a fourth embodiment of the present invention. In FIG. 6, constituent elements having the same reference numerals or symbols as those in FIG. 1 are denoted by the same reference numerals or symbols. In FIG. 6, reference numeral 151 denotes a charge barrier n layer having a carrier concentration higher than the drift n⁻ layer 110.

The structure of FIG. 6 is featured in that the charge barrier n layer 151 is added to the structure of FIG. 1. Since the presence of the charge barrier n layer 151 having a potential higher than the drift n⁻ layer 110 causes holes flowing into the emitter to be dammed or blocked, a hole concentration of the drift n⁻ layer 110 in the vicinity of the emitter is increased with a reduced resistance. As a result, the ON voltage of the structure of FIG. 6 can be effectively decreased more than that of the structure of FIG. 1.

The present structure can have effects similar to those in FIG. 1, and the variation set forth in the embodiment 1 can also have effects similar thereto, with optimum conditions similar thereto. When the present structure is applied to the structures of the embodiments 2 and 3, the present structure can have effects similar to those of the structures of the embodiments 2 and 3.

Embodiment 5

Figure 7:
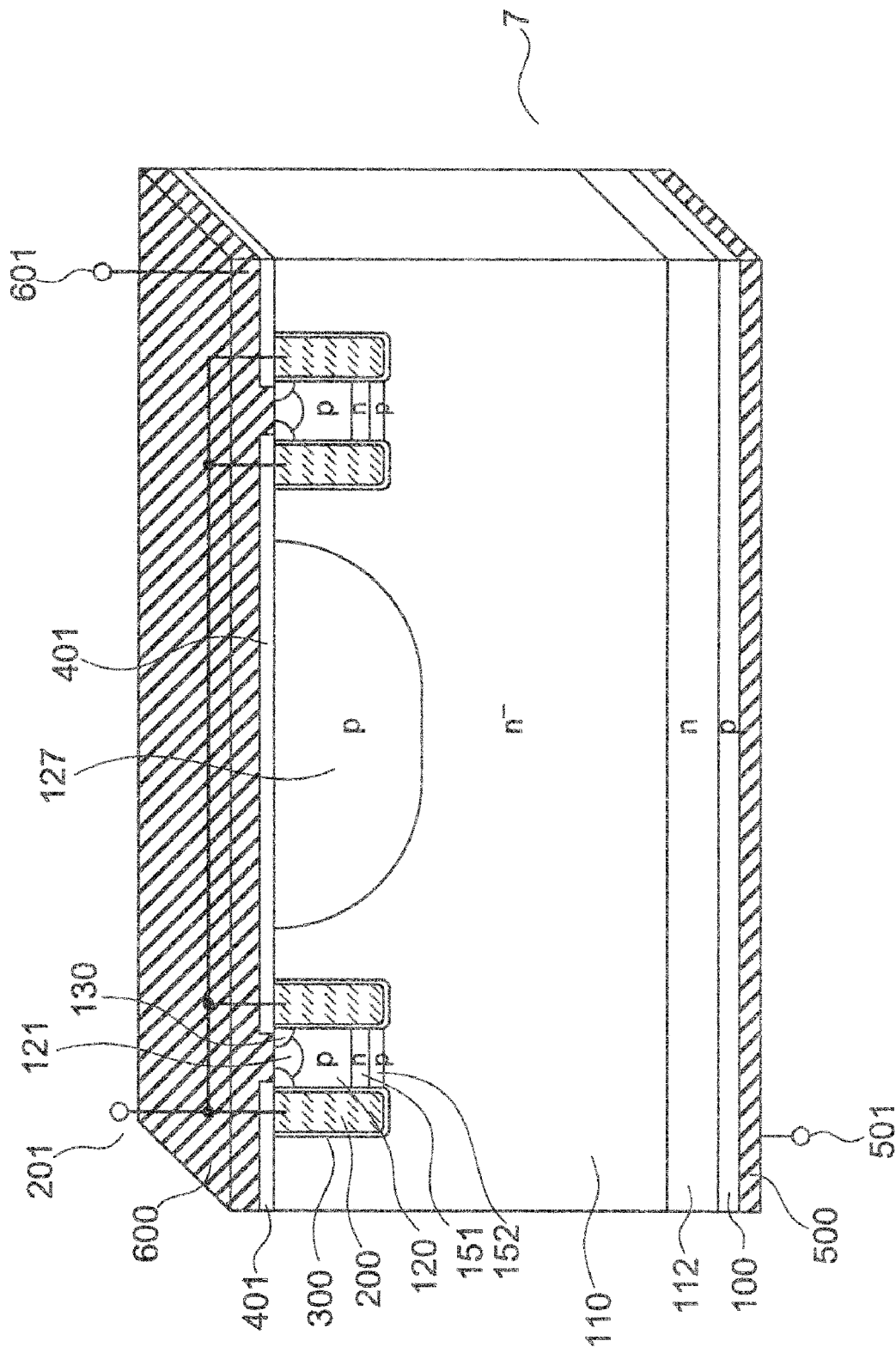
FIG. 7 shows a cross-sectional view of a semiconductor device in accordance with a fifth embodiment of the present invention.

FIG. 7 shows a cross-sectional view of a structure in accordance with a fifth embodiment of the present invention. In FIG. 7, constituent elements having the same reference numerals or symbols as those in FIG. 6 are denoted by the same reference numerals or symbols. In FIG. 7, reference numeral 152 denotes a p layer having a carrier concentration higher than the drift n⁻ layer 110.

In the structure of the embodiment 4, the higher the carrier concentration of the charge barrier n layer 151 is the higher the potential to holes is. Thus the hole concentration of the drift n⁻ layer 110 in the vicinity of the emitter and the ON voltage can be reduced. Meanwhile, when the carrier concentration of the charge barrier n layer 151 is increased in the OFF state, the electric field intensity at this part of the charge barrier n layer 151 becomes high and the breakdown voltage is decreased. The carrier concentration of the charge barrier n layer 151 has an upper limit determined by the breakdown voltage.

The structure of the embodiment 5 is arranged so as to further increase the upper limit of the carrier concentration of the charge barrier n layer 151 and to further reduce the ON voltage. The feature of FIG. 7 lies in addition of the p layer 152 to FIG. 6 of the embodiment 4.

With this structure, the depletion layer in the OFF state is extended from an interface between the p layer 152 and the drift n⁻ layer 110. Thus, adjustment of the carrier concentration of the p layer 152 enables the breakdown voltage to be surely increased, which leads to the fact that the carrier concentration of the charge barrier n layer 151 can be set at a value higher than the upper limit of the breakdown voltage design of the embodiment 4 and the ON voltage can be reduced.

The present structure can have effects similar to those of the embodiment 1, and the variation set forth in the embodiment 1 can also have effects similar thereto, with optimum conditions similar thereto. When the structures of the embodiments 2 and 3 are applied to the present structure, the present structure can have effects similar thereto.

Embodiment 6

Figure 8:
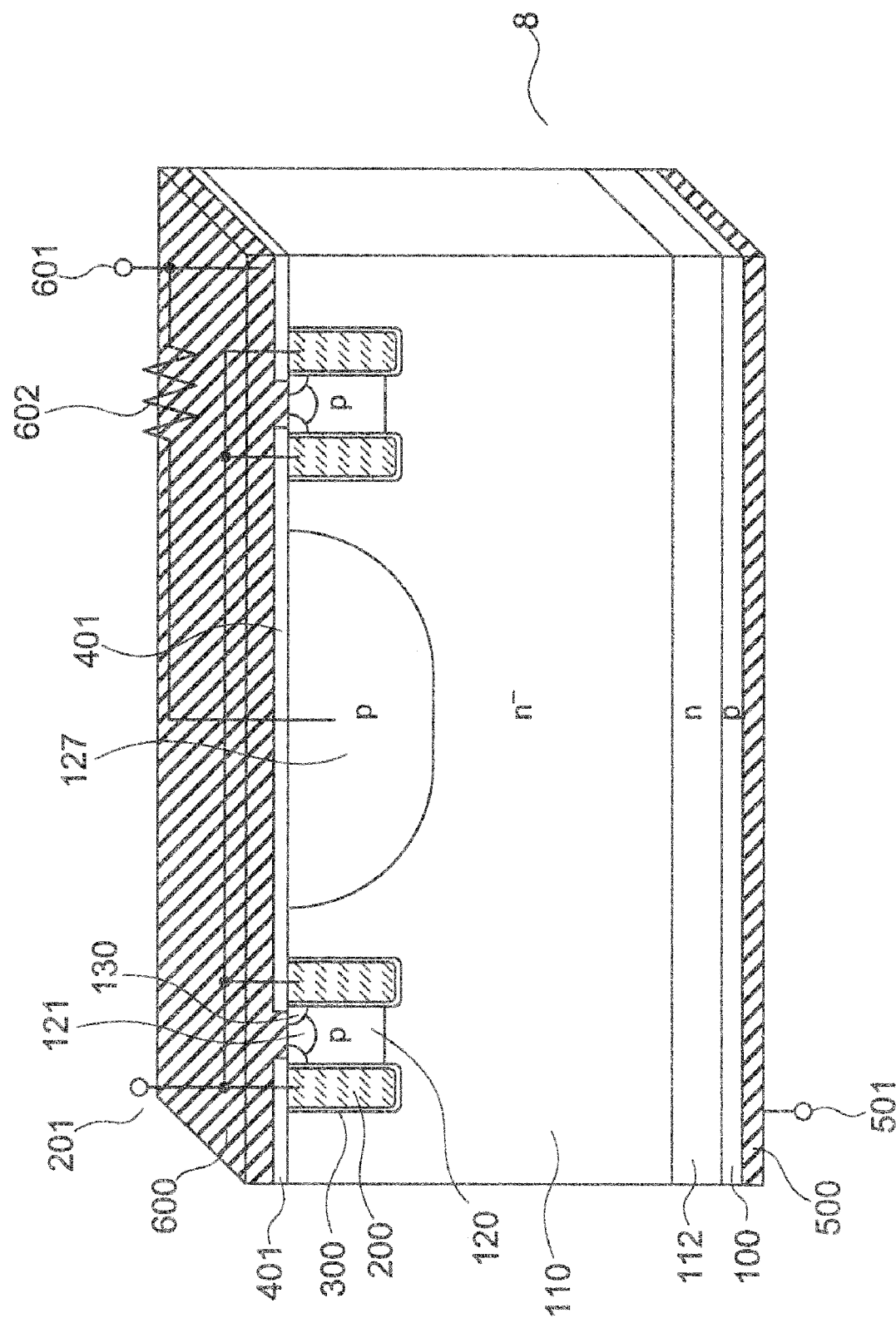
FIG. 8 shows a cross-sectional view of a semiconductor device in accordance with a sixth embodiment of the present invention.

FIG. 8 shows a cross-sectional view of a structure in accordance with a sixth embodiment of the present invention. In FIG. 8, constituent elements having the same reference numerals or symbols as those in FIG. 1 are denoted by the same reference numerals or symbols. In FIG. 8, reference numeral 602 denotes a resistance.

FIG. 8 is featured in that the floating p layer 127 in the structure of FIG. 1 is electrically connected to the emitter electrode 600. As a result, since an increase in the potential of the floating p layer 127 is suppressed, a diode surge voltage of the paired arms upon the IGBT turn-on operation can be adjusted.

The contact of the floating p layer 127 may be achieved by a direct electrode forming method, through another diffusion layer contacted with the floating p layer 127, from the peripheral or internal regions of these devices, or continuously or discontinuously in the form of a plurality of contacts. Further when the floating p layer 127 is electrically connected to the emitter electrode 600 via the resistance 602 having a certain size, electric charges passed through the floating p layer 127 can be suppressed from directly going to the emitter electrode 600, whereby an increase in the charge concentration under the floating p layer 127 as the effect of the present structure can be kept.

The resistance 602 is not specifically restricted so long as the resistance 602 is a diffusion layer, a built-in resistance of polysilicon or the like, or a resistance such as an externally-connected resistance, to be contacted with the floating p layer 127.

Figure 9:
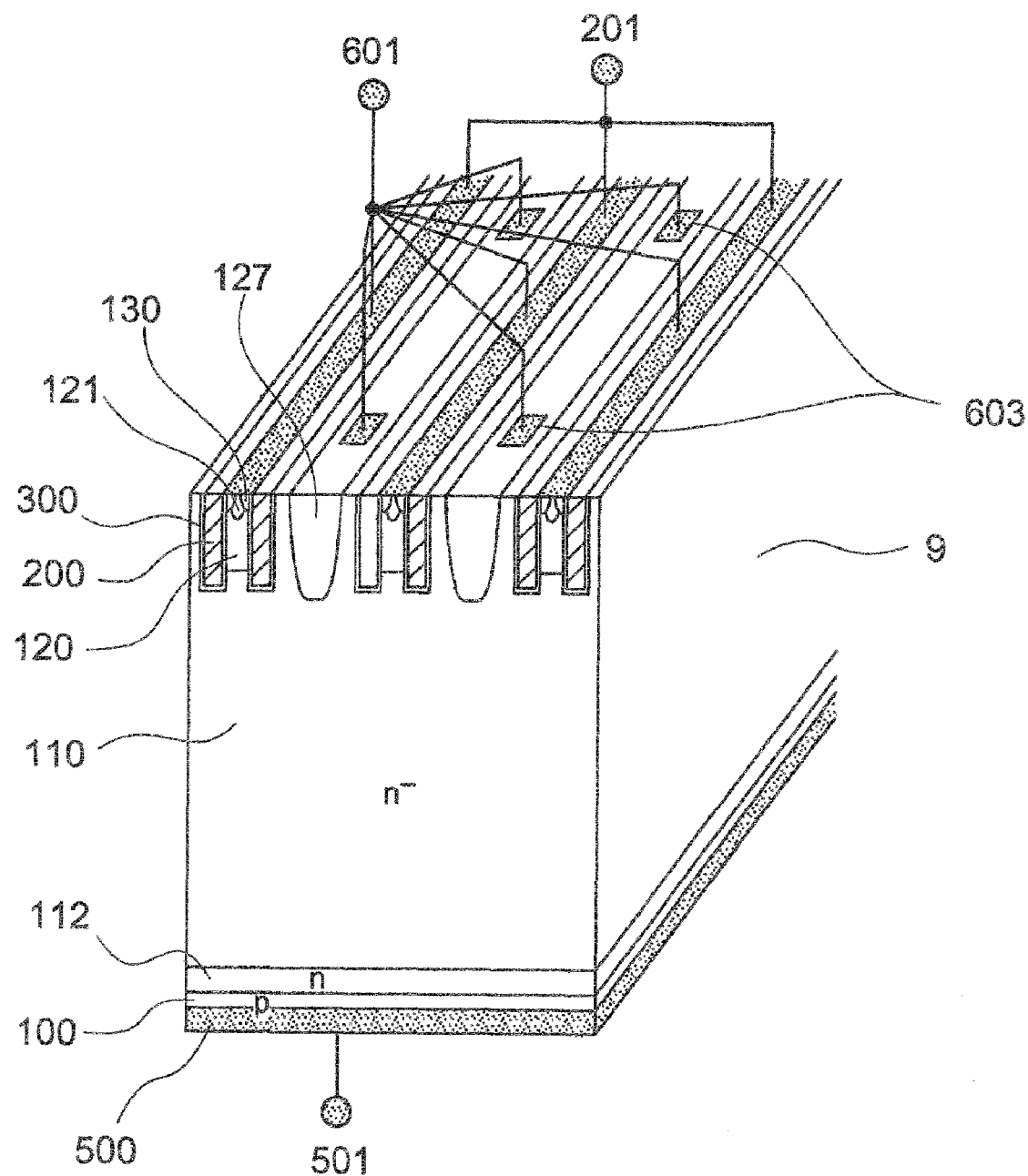
FIG. 9 shows a partial perspective view of a part of the sixth embodiment.

FIG. 9 shows a cross-sectional view of a structure in accordance with a sixth embodiment of the present invention. In FIG. 9, constituent elements having the same reference numerals or symbols as those in FIG. 8 are denoted by the same reference numerals or symbols. In FIG. 9, reference numeral 603 denotes a floating p layer contact, which is arranged discontinuously.

In the structure of FIG. 9, since parts of the floating p layer 127 sufficiently spaced from the floating p layer contacts 603 are connected to the emitter electrode 600 through the resistance per se of the floating p layer 127 proportional to the spaced distance, such effects as mentioned above in connection with FIG. 8 can be obtained. It is advantageous that the effects can be easily designed by adjusting the distance or number of the disconnections of the floating p layer contact 603.

Figure 10:
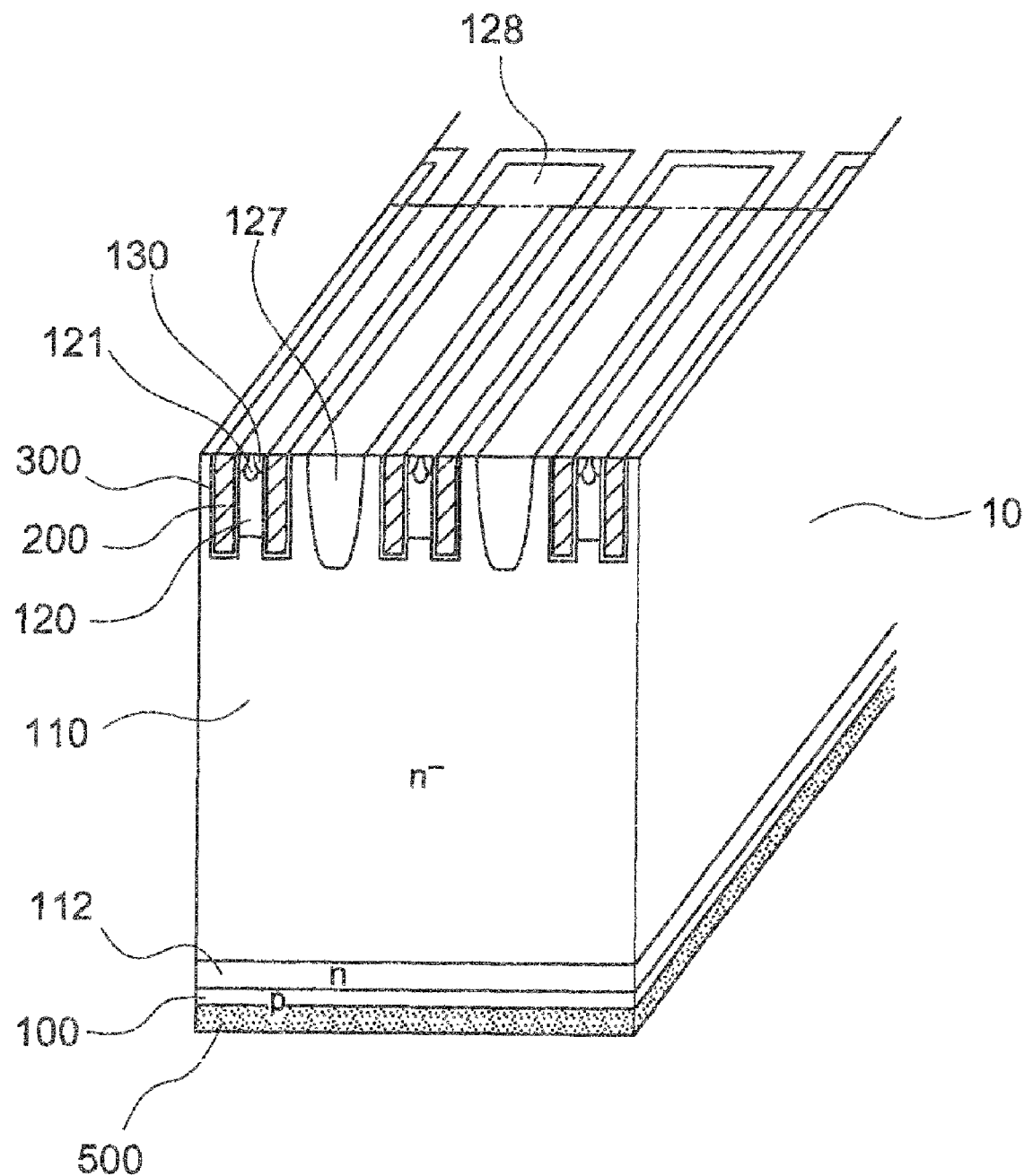
FIG. 10 is a partial perspective view of the embodiment showing another layout of gate termination ends and peripheral breakdown voltage structure in the present invention.

FIG. 10 is an embodiment showing a layout of gate termination ends and peripheral breakdown voltage structure in the present invention. In FIG. 10, constituent elements having the same reference numerals or symbols in FIG. 1 are denoted by the same reference numerals or symbols. In FIG. 10, reference numeral 128 denotes a p layer.

A feature of FIG. 10 lies in that the floating p layer 127 is contacted with the p layer 128, securing a high breakdown voltage even at the termination ends of the trench gates. With this layout, when the p layer 128 is connected to the emitter electrode 600 or connected thereto through a resistance, the potential is fixed. This results in that the breakdown voltage can be made further high with effects similar to those in FIGS. 8 and 9. In addition, the p layer 128 is made to form an obtuse angle at a contact between the floating p layer 127 and the p layer 128, the field concentration can also be reduced. The p layer 128 may be made of the same layer as the channel p layer 120, the floating p layer 127 or a deep p layer for peripheral breakdown voltage structure, or made of a combination of such layers, thus enabling simplification of its process.

The structures of FIGS. 8, 9 and 10 can have effects similar to those explained in the embodiment 1. Even for a variation of the embodiment 1 and the optimum conditions thereof, similar effects can be obtained.

Embodiment 7

Figure 11:
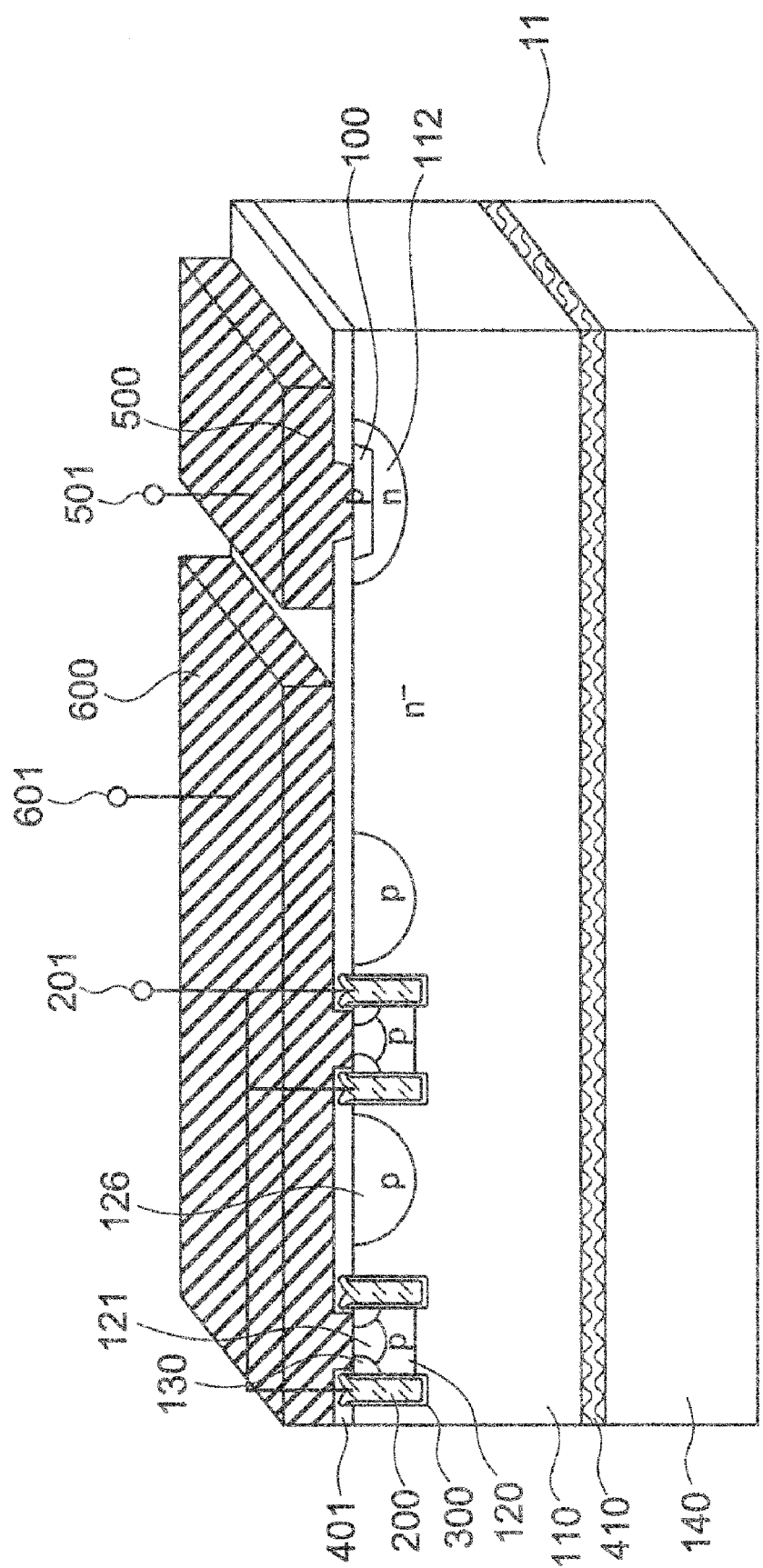
FIG. 11 shows a cross-sectional view of a semiconductor device in accordance with a seventh embodiment of the present invention.

FIG. 11 shows a cross-sectional view of a structure in accordance with a seventh embodiment of the present invention. In FIG. 11, constituent elements having the same reference numerals or symbols as those in FIG. 1 are denoted by the same reference numerals or symbols. In FIG. 11, reference numeral 140 denotes a semiconductor substrate, and numeral 410 denotes an insulating film (layer).

FIG. 11 is featured in that the IGBT of FIG. 1 is arranged to form a horizontal type. Even this structure has effects similar to those in the embodiment 1, and a variation of the embodiment 1 or the optimum conditions thereof can have similar effects. When the structures of the embodiments 2 to 6 are applied to the present structure, the present structure can have effects similar thereto.

In particular, when the present structure is made to be of a horizontal type, a control circuit or a drive circuit therefore can be mounted or integrated, and thus its additional functions can be improved. By utilizing p-n isolation, dielectric isolation, or SOI (Silicon on Insulator) substrate, a parasitic element can be made to be latch-up free, which is advantageous in a functional power converter or the like.

Embodiment 8

Figure 12:
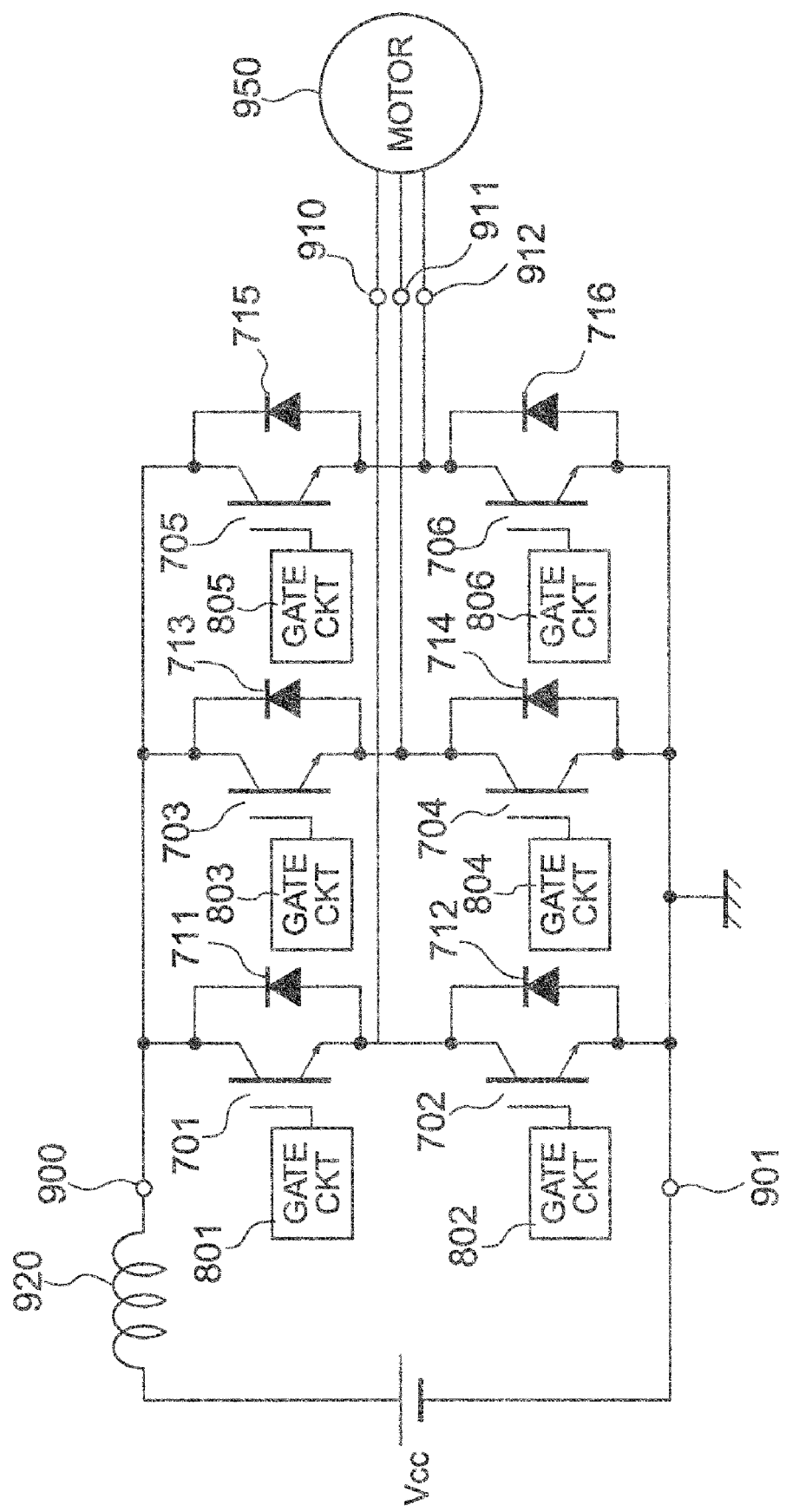
FIG. 12 is a circuit configuration of a power converter in accordance with an eighth embodiment of the present invention.

FIG. 12 shows a circuit diagram of a power converter as an eighth embodiment of the present invention. More specifically, FIG. 12 shows an arrangement of an inverter, wherein reference numerals 701 to 706 denote IGBTs, numerals 711 to 716 denote diodes, 801 to 806 denotes gate circuits, 900 denotes a P terminal, 901 an N terminal, 910, 911 and 912 denote U, V and W terminals respectively, 920 a main circuit inductance, 950 a motor.

A feature of FIG. 12 lies in that the IGBTs of the structures explained in the embodiments 1 to 7 are applied to the IGBTs 701 to 706. The inverter of FIG. 12, to which the IGBTs of the embodiments 1 to 7 is applied, can have a low loss and a high reliability due to its IGBT effects.

The arrangement of the inverter of FIG. 12 is illustrated merely as an example. For example, when a switching element and a diode are connected in reverse parallel to form a parallel circuit, a pair of such parallel circuits are connected in series to form a series circuit, and such series circuits are provided to correspond in number to phases to form an inverter; the inverter can also have similar effects.

Although such an inverter as to convert a DC current to an AC current in the present embodiment, the present invention is not limited to this specific example. Thus it will be obvious to those skill in the art that even such a converter as to convert an AC current to a DC current can have similar effects.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device comprising:
   a semiconductor substrate having a pair of main surfaces;
   a first semiconductor region of a first conductivity type positioned adjacent to one of the main surfaces of the semiconductor substrate and located within the semiconductor substrate;
   a second semiconductor region of a second conductivity type provided adjacent to the first semiconductor region and having a carrier concentration lower than a carrier concentration of the first semiconductor region;
   a third semiconductor region of the second conductivity type provided adjacent to the second semiconductor region and having a carrier concentration lower than the carrier concentration of the second semiconductor region;
   a plurality of MOS type trench gates extended from one of the main surfaces of the semiconductor substrate into the third semiconductor region to have at least two sorts of different intervals;
   a fourth semiconductor region of the first conductivity type provided between the MOS type trench gates having a narrow adjacent interval and having a carrier concentration higher than the carrier concentration of the third semiconductor region;
   a fifth semiconductor region of the second conductivity type provided between the MOS type trench gates having the narrow adjacent interval, located within the fourth semiconductor region to be adjacent to the MOS type trench gates, and having a carrier concentration higher than the carrier concentration of the fourth semiconductor region;
   a sixth semiconductor region of the first conductivity type located between the MOS type trench gates having an adjacent interval larger than the narrow interval and having a carrier concentration higher than the carrier concentration of the third semiconductor region;
   a first electrode located between the MOS type trench gates having the narrow adjacent interval to be contacted with the fourth and fifth semiconductor regions; and
   a second electrode contacted with the first semiconductor region,
   wherein the sixth semiconductor region extends from one main surface of the semiconductor substrate into the third semiconductor region and is exposed at a part of the one main surface,
   the third semiconductor region is exposed at the part of the one main surface, between the sixth semiconductor region and the trench gate, and includes a part which extends from the part of the one main surface into the semiconductor substrate, and
   the sixth semiconductor region and the trench gate are isolated by the part of the third semiconductor region.

2. A semiconductor device according to claim 1, wherein the sixth semiconductor region is spaced from the trench gates by a distance not larger than 10 µm.

3. A semiconductor device according to claim 1, wherein the sixth semiconductor region is deeper than the fourth semiconductor region.

4. A semiconductor device according to claim 1, wherein the fourth semiconductor region is formed to cover a lower side of the trench gates.

5. A semiconductor device according to claim 1, further comprising:
   a seventh semiconductor region of the second conductivity type which is provided between the MOS type trench gates having the adjacent narrow interval, located between the third and fourth semiconductor regions to be adjacent to the MOS type trench gates, and has a carrier concentration higher than the carrier concentration of the third semiconductor region.

6. A semiconductor device according to claim 5, further comprising:
   an eighth semiconductor region of the first conductivity type which is located between the third and seventh semiconductor regions, contacted with the MOS type trench gates, and has a carrier concentration higher than the carrier concentration of the third semiconductor region.

7. A semiconductor device according to claim 1, wherein the sixth semiconductor region is contacted with the first electrode directly or through a resistance.

8. A power converter comprising:
   a pair of DC terminals;
   AC terminals corresponding in number to phases of an AC source; and
   a plurality of power conversion units connected between the pair of DC terminals,
   wherein each of the power conversion units has a series circuit of two parallel circuits each having a switching element and a diode of a polarity opposite to the switching element, the power conversion units have the AC terminals as different mutual interconnection points between the two parallel circuits, and the switching element is the semiconductor device set forth in claim 1.

* * * * *